United States Patent
Doblar et al.

(10) Patent No.: US 7,779,285 B2
(45) Date of Patent: Aug. 17, 2010

(54) MEMORY SYSTEM INCLUDING INDEPENDENT ISOLATED POWER FOR EACH MEMORY MODULE

(75) Inventors: Drew G. Doblar, San Jose, CA (US); Emrys J. Williams, Eversholt (GB)

(73) Assignee: Oracle America, Inc., Redwood Shores, CA (US)

( * ) Notice: Subject to any disclaimer, the term of this patent is extended or adjusted under 35 U.S.C. 154(b) by 629 days.

(21) Appl. No.: 10/370,386

(22) Filed: Feb. 18, 2003

(65) Prior Publication Data

US 2004/0163002 A1    Aug. 19, 2004

(51) Int. Cl.
G06F 1/30       (2006.01)
G06F 11/30      (2006.01)

(52) U.S. Cl. .................. 713/340; 713/324; 714/8; 714/48

(58) Field of Classification Search .......... 714/100, 714/8, 48; 713/310, 324, 340
See application file for complete search history.

(56) References Cited

U.S. PATENT DOCUMENTS

| | | | |
|---|---|---|---|
| 4,376,300 A | 3/1983 | Tsang | |
| 4,584,681 A | 4/1986 | Singh et al. | |
| 4,604,751 A | 8/1986 | Aichelmann, Jr. et al. | |
| 4,965,717 A * | 10/1990 | Cutts et al. | 714/12 |
| 5,058,115 A | 10/1991 | Blake et al. | |
| 5,077,737 A | 12/1991 | Leger et al. | |
| 5,126,910 A * | 6/1992 | Windsor et al. | 361/42 |
| 5,164,944 A | 11/1992 | Benton et al. | |
| 5,228,046 A | 7/1993 | Blake et al. | |
| 5,233,614 A | 8/1993 | Singh | |
| 5,255,226 A | 10/1993 | Ohno et al. | |
| 5,276,834 A | 1/1994 | Mauritz et al. | |
| 5,291,496 A | 3/1994 | Andaleon et al. | |
| 5,300,765 A * | 4/1994 | Mizuta | 235/492 |
| 5,490,155 A | 2/1996 | Abdoo et al. | |
| 5,502,675 A | 3/1996 | Kohno et al. | |
| 5,640,353 A | 6/1997 | Ju | |
| 5,682,394 A | 10/1997 | Blake et al. | |
| 5,758,056 A | 5/1998 | Barr | |
| 5,822,257 A | 10/1998 | Ogawa | |
| 5,872,790 A | 2/1999 | Dixon | |
| 5,909,541 A | 6/1999 | Sampson et al. | |
| 5,910,725 A * | 6/1999 | Gist | 323/313 |
| 5,923,682 A | 7/1999 | Seyyedy | |
| 5,928,367 A | 7/1999 | Nelson et al. | |
| 5,941,997 A * | 8/1999 | Greaves | 714/48 |

(Continued)

OTHER PUBLICATIONS

"The Authoritative Dictionary of IEEE Standards Terms," 7th edition, Dec. 2000, IEEE Press Publications, ISBN 0-7381-2601-2.*

Primary Examiner—Thuan N Du
(74) Attorney, Agent, or Firm—Meyertons, Hood, Kivlin, Kowert & Goetzel, P.C.; Stephen J. Curran

(57) ABSTRACT

A memory system including independent power for each memory module. The memory system includes a plurality of memory modules each including a plurality of memory chips configured to store data. The memory system further includes a power conversion unit coupled to provide power to each of the plurality of memory modules via a respective power conduit. Each of the respective power conduits is electrically isolated from each other power conduit.

14 Claims, 4 Drawing Sheets

U.S. PATENT DOCUMENTS

| | | |
|---|---|---|
| 5,953,265 A | 9/1999 | Walton et al. |
| 5,978,952 A | 11/1999 | Hayek et al. |
| 5,987,628 A | 11/1999 | Von Bokern et al. |
| 6,009,548 A | 12/1999 | Chen et al. |
| 6,018,817 A | 1/2000 | Chen et al. |
| 6,038,680 A | 3/2000 | Olarig |
| 6,044,483 A | 3/2000 | Chen et al. |
| 6,052,818 A | 4/2000 | Dell et al. |
| 6,065,102 A | 5/2000 | Peters et al. |
| 6,070,255 A | 5/2000 | Dell et al. |
| 6,076,182 A | 6/2000 | Jeddeloh |
| 6,101,614 A | 8/2000 | Gonzales et al. |
| 6,115,828 A | 9/2000 | Tsutsumi et al. |
| 6,141,789 A | 10/2000 | Cypher |
| 6,158,025 A | 12/2000 | Brisse et al. |
| 6,167,495 A | 12/2000 | Keeth et al. |
| 6,181,614 B1 | 1/2001 | Aipperspach et al. |
| 6,209,113 B1 | 3/2001 | Roohparvar |
| 6,223,301 B1 | 4/2001 | Santeler et al. |
| 6,233,717 B1 | 5/2001 | Choi |
| 6,246,616 B1 | 6/2001 | Nagai et al. |
| 6,356,498 B1 * | 3/2002 | Keeth ................. 365/226 |
| 6,766,429 B1 * | 7/2004 | Bland et al. ............ 711/161 |
| 2001/0001158 A1 | 5/2001 | Tetrick |
| 2001/0042228 A1 * | 11/2001 | Klein .................... 714/48 |
| 2004/0003336 A1 * | 1/2004 | Cypher ................. 714/763 |
| 2004/0003337 A1 * | 1/2004 | Cypher ................. 714/763 |
| 2004/0088636 A1 * | 5/2004 | Cypher ................. 714/764 |

\* cited by examiner

MEMORY SYSTEM INCLUDING INDEPENDENT ISOLATED POWER FOR EACH MEMORY MODULE

BACKGROUND OF THE INVENTION

1. Field of the Invention

This invention relates to memory subsystems and, more particularly, to power distribution to the memory modules of a memory subsystem.

2. Description of the Related Art

Computer systems are typically available in a range of configurations which may afford a user varying degrees of reliability, availability and serviceability (RAS). In some systems, reliability may be paramount. Thus, a reliable system may include features designed to prevent failures. In other systems, availability may be important and so systems may be designed to have significant fail-over capabilities in the event of a failure. Either of these types of systems may include built-in redundancies of critical components. In addition, systems may be designed with serviceability in mind. Such systems may allow fast system recovery during system failures due to component accessibility. In critical systems, such as high-end servers and some multiple processor and distributed processing systems, a combination of the above features may produce the desired RAS level.

In many computer systems, one or more processors may be connected to a memory subsystem which includes memory modules. Each memory module may be mated to a system board via an edge connector and socket arrangement. The socket may be located on a memory subsystem circuit board and each memory module may have an edge connector which may be inserted into the socket, for example.

The memory module circuit board typically has contact pads or "fingers" arranged on both sides and along one edge of the circuit board. This edge of the circuit board is inserted into a socket having spring-loaded contacts for mating with the fingers. The socket arrangement allows the memory modules to be removed and replaced by a user. In many systems, the memory module connectors are mounted on a motherboard or system board such that the memory modules connect to a memory bus or interconnect one row after another or in a daisy chain. In some cases a computer system may be provided with a given number of memory modules and a user may add modules to expand the system memory capacity.

From a reliability standpoint, each component and signal connection may contribute to a given circuit board's or a given system's overall mean time between failure (MTBF). For a memory subsystem, damaged contact pads or a failing component on a single memory module which can cause a short circuit between power and ground could disable every other memory module receiving power from the same power rail. For example, a filter capacitor coupled between Vdd and Ground becomes shorted, one transistor of a complimentary metal oxide semiconductor (CMOS) inverter becomes "stuck on" or a damaged memory module socket shorts Vdd to Ground. Any of these failure modes could conceivably take down the entire memory subsystem. Thus, it may be desirable to protect a memory system against these types of failures, particularly in systems expected to have high RAS levels.

SUMMARY OF THE INVENTION

Various embodiments of a memory system including independent power for each memory module are disclosed. In one embodiment, the memory system includes a plurality of memory modules each including a plurality of memory chips configured to store data. The memory system further includes a power conversion unit coupled to provide power to each of the plurality of memory modules via a respective power conduit. Each of the respective power conduits is electrically isolated from each other power conduit.

Figure 1:
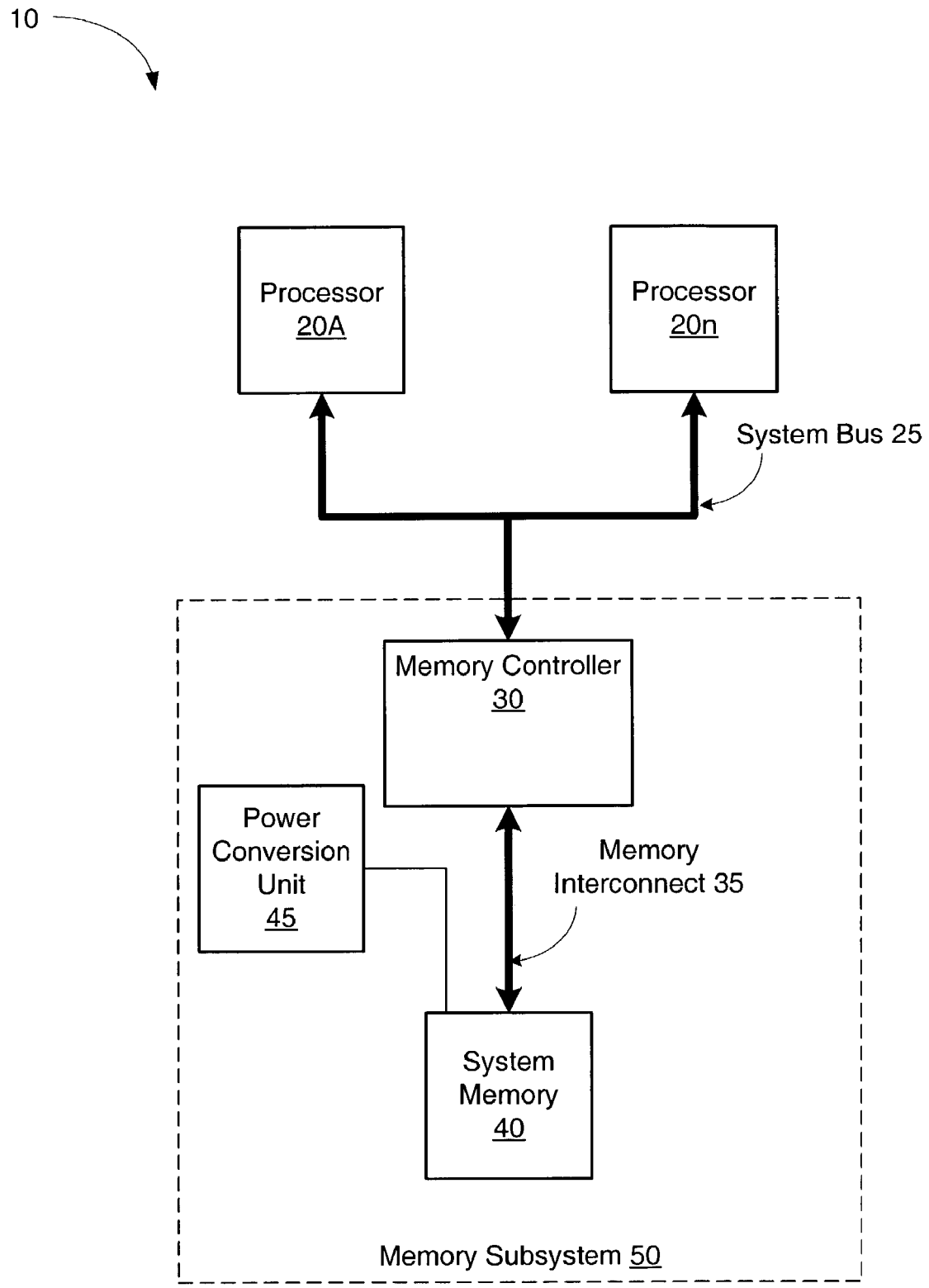
FIG. 1 is a block diagram of one embodiment of a computer system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Turning now to FIG. 1, a block diagram of one embodiment of a computer system is shown. Computer system 10 includes a plurality of processors 20A-20n connected to a memory subsystem 50 via a system bus 25. Memory subsystem 50 includes a memory controller 30 coupled to a system memory 40 via a memory interconnect 35. Memory subsystem 50 also includes a power conversion unit 45 coupled to supply power to system memory 40. It is noted that elements referred to herein with a particular reference number followed by a letter may be collectively referred to by the reference number alone. For example, processor 20A-n may be collectively referred to as processor 20.

Generally speaking, processor 20 may access memory subsystem 50 by initiating a memory request transaction such as a memory read or a memory write to memory controller 30 via system bus 25. Memory controller 30 may then control the storing to and retrieval of data from system memory 40 by issuing memory request commands to system memory 40 via memory interconnect 35. Memory interconnect 35 may convey address and control information and data between system memory 40 and memory controller 30.

Memory controller 30 may be configured to store data and instruction code within system memory 40 for use by processor 20. System memory 40 may be implemented using expandable blocks of memory such as memory modules. For example, in one embodiment dual in-line memory modules (DIMM) may be used. Each DIMM may employ a plurality of random access memory chips such as dynamic random access memory (DRAM), for example. Each DIMM may be mated to a system board via an edge connector and socket arrangement. The socket may be located on a system board and each DIMM may have an edge connector which may be inserted into the socket, for example. It is noted that in other embodiments, other types of memory modules may be used.

As will be described in greater detail below in conjunction with the descriptions of FIG. 2 and FIG. 3, power conversion unit 45 may be a DC to DC converter configured to provide a DC operating voltage for components of memory subsystem 50. Further, each of the memory modules within system memory 40 may receive power from power conversion unit 45 via an independent power conduit which is isolated from each other power conduit.

Figure 2:
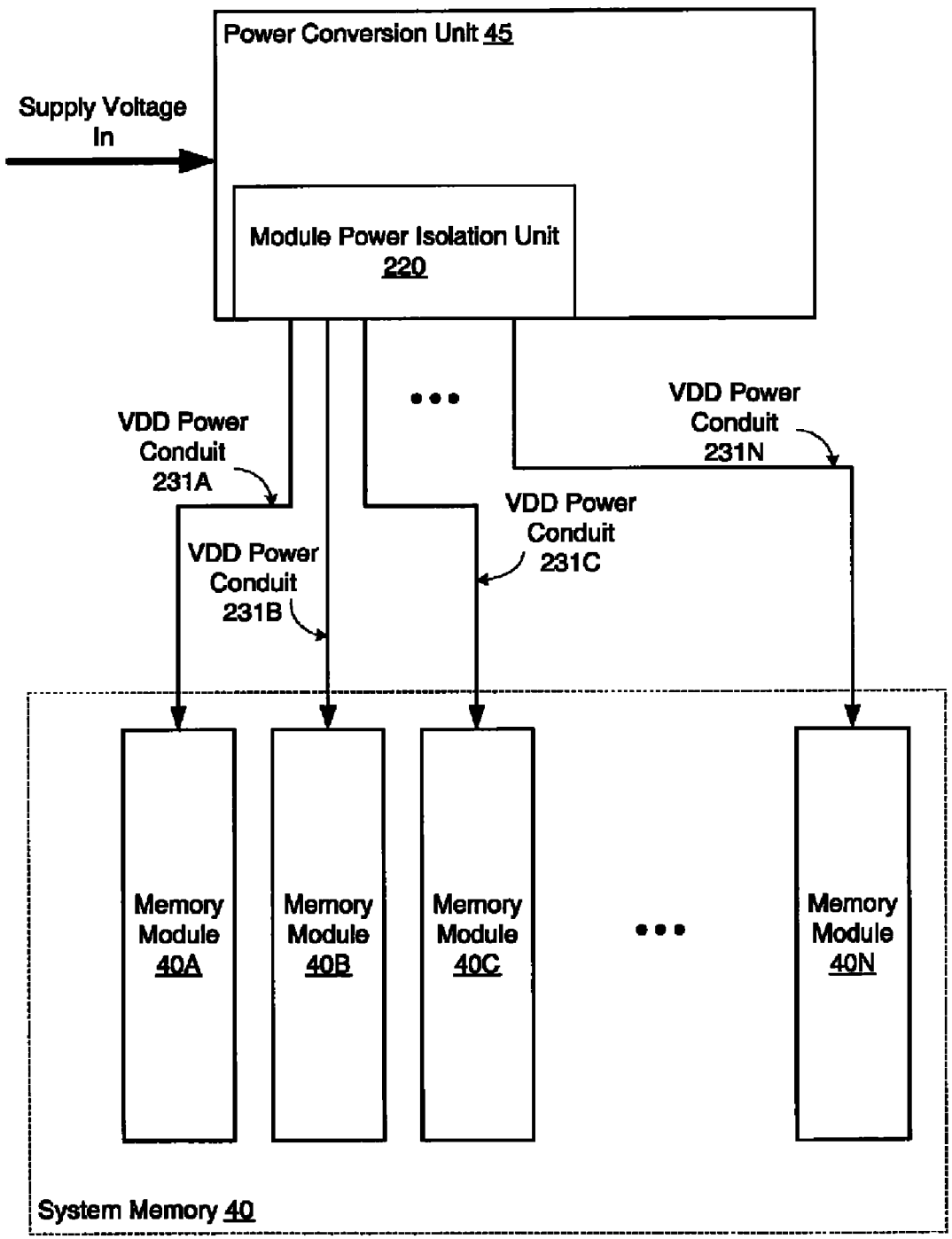
FIG. 2 is a block diagram illustrating one embodiment of power distribution to the memory modules of a memory subsystem.

Referring to FIG. 2 a block diagram illustrating one embodiment of the power distribution to system memory 40 of FIG. 1 is shown. Circuit components corresponding to those in FIG. 1 are numbered identically for simplicity and clarity. System memory 40 includes a plurality of memory modules, designated 40A through 40N, where N may be any number of memory modules. Power conversion unit 45 is coupled to provide power to system memory 40 via multiple respective power conduits, designated 231A-N.

In the illustrated embodiment, each of memory modules 40A-N receives power from power conversion unit 45 via a respective independent power conduit 231. As used herein, a power conduit refers to any type of connection used to convey voltage and current. For example, in one embodiment, a power conduit may be a trace on a circuit board. In another embodiment, a power conduit may be a wire.

In the illustrated embodiment, power conversion unit 45 receives a supply voltage such as 48 VDC, for example, and converts it to a lower voltage such as 1 VDC which is used as the Vdd supply. It is contemplated however, that other voltages may be used. Power conversion unit 45 includes a module power isolation unit 220. Module power isolation unit 220 is configured to provide isolated Vdd power to each of memory modules 40A-N. In one embodiment, module power isolation unit 220 may include multiple isolation circuits (not shown) each configured to sense the current in a given power conduit 231 and to disable or interrupt power to a power conduit 231 carrying excessive current. For example, if memory module 40A causes excessive current, memory module 40A may have its Vdd power removed. This isolation of Vdd power between memory modules 40A-N may prevent a Vdd to Gnd short circuit on any given memory module from causing every other memory module to lose Vdd power.

If module power isolation unit 220 disables Vdd power to a given memory module, as described above, power conversion unit 45 may notify memory controller 30 of the failure. As will be described below in conjunction with the description of FIG. 4, memory controller 30 may be configured to correct any data errors caused by the loss of the memory module using parity information stored in redundant memory modules.

It is noted that each of the isolation circuits (not shown) described above may be implemented in a variety of well-known power switching technologies. For example, in one embodiment a power field effect transistor (FET) may be used as a switch which passes Vdd to power conduit 231. The gate of the power FET may be coupled to a sensing circuit which monitors the current and voltage in each power conduit 231.

It is further noted that in an alternative embodiment, in place of module power isolation unit 220, power conversion unit 45 may include N isolated Vdd power supplies (not shown), each one supplying Vdd to a respective power conduit 231. In such an embodiment, if a given memory module 40 causes excessive current, that one memory module may have its Vdd power removed by shutting down the corresponding power supply.

Figure 3:
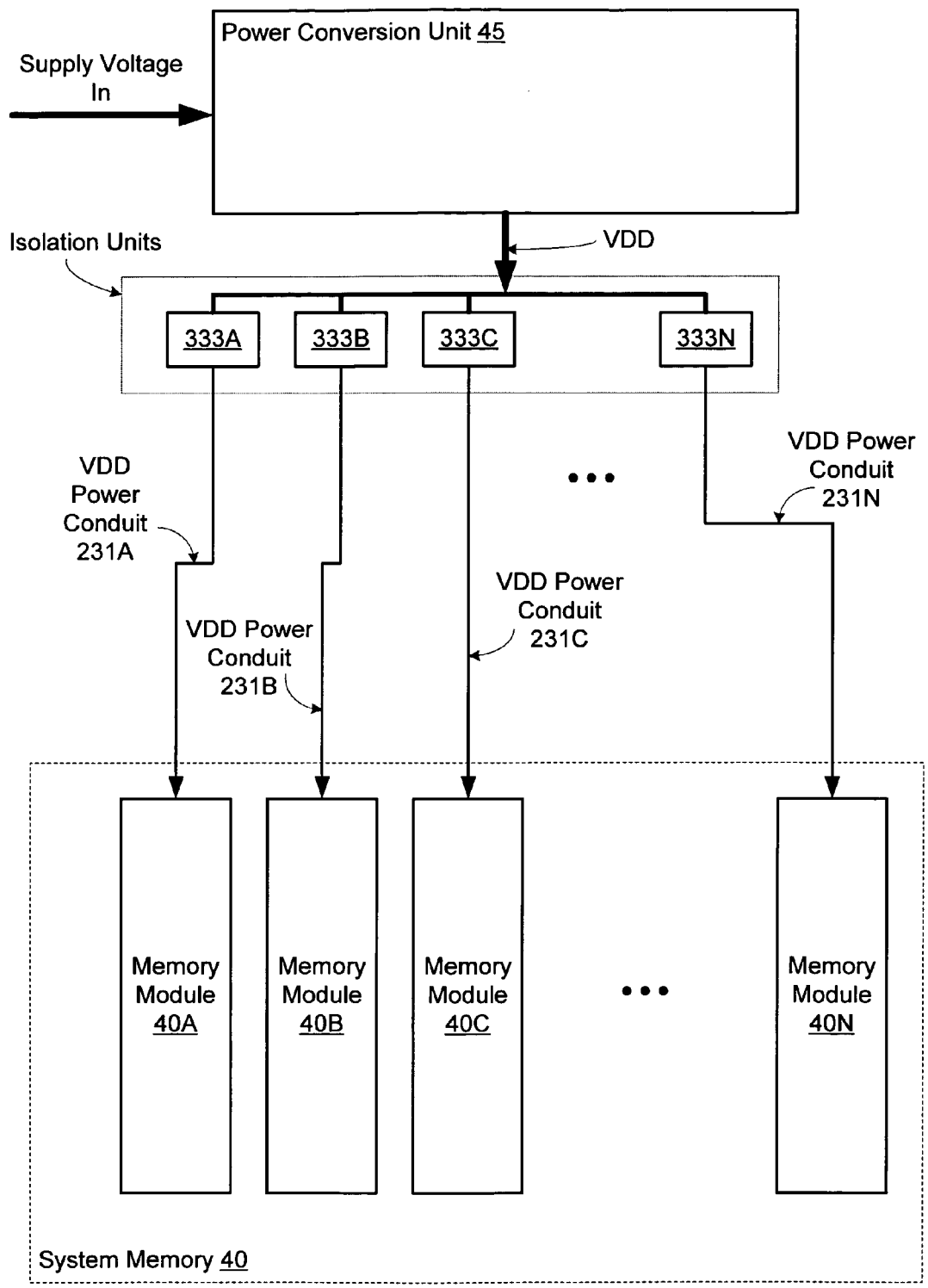
FIG. 3 is a block diagram illustrating an alternative embodiment of power distribution to the memory modules of a memory subsystem.

Turning to FIG. 3, a block diagram illustrating an alternative embodiment of the power distribution to system memory 40 of FIG. 1 is shown. Circuit components corresponding to those in FIG. 1-FIG. 2 are numbered identically for simplicity and clarity. Memory subsystem 50 includes a plurality of memory modules, designated 40A through 40N, where N may be any number of memory modules. Power conversion unit 45 is coupled to system memory 40 via multiple respective power conduits, designated 231A-N. Isolation units 333A-333N are coupled between power conversion unit 45 and each of power conduits 231A-N, respectively.

Similar to the embodiment described above in conjunction with the description of FIG. 2, each of memory modules 40A-N of FIG. 3 receives power from power conversion unit 45 via a respective independent power conduit 231. However, in the embodiment illustrated in FIG. 3, each of power conduits 231A-N is supplied by a respective isolation unit 333.

In the illustrated embodiment, power conversion unit 45 receives a supply voltage such as 48 VDC, for example, and converts it to a lower voltage such as 1 VDC which is used as the Vdd supply. It is contemplated however, that other voltages may be used. Power conversion unit 45 may provide Vdd to each isolation unit 333A-N. Each of isolation units 333A-N may be configured to isolate the respective power conduit to which it is coupled and thus each isolate memory module from each other with respect to Vdd power. Each isolation unit 333 may be configured to sense the current in a corresponding power conduit 231 and to disable or interrupt power to that power conduit 231 exhibiting excessive current. For example, if memory module 40B causes excessive current, memory module 40B may have its Vdd power removed by corresponding isolation unit 333B. This isolation of Vdd power between memory modules 40A-N may prevent a Vdd to Gnd short circuit on any given memory module from causing every other memory module to lose Vdd power.

It is noted that each of the isolation units 333A-N described above may be implemented in a variety of well-known power switching technologies. For example, in one embodiment a power field effect transistor (FET) may be used as a switch which passes Vdd to a power conduit 231. The gate of the power FET may be coupled to a sensing circuit which monitors the current and voltage in each power conduit 231.

In one embodiment, if any of isolation units 333 disables Vdd power to a given memory module, as described above, the responsible isolation unit 333 may notify power conversion unit 45 which may in turn notify memory controller 30 of the failure. As will be described below in conjunction with the description of FIG. 4, memory controller 30 may be configured to correct any data errors caused by the loss of the memory module using parity information stored in redundant memory modules.

Figure 4:
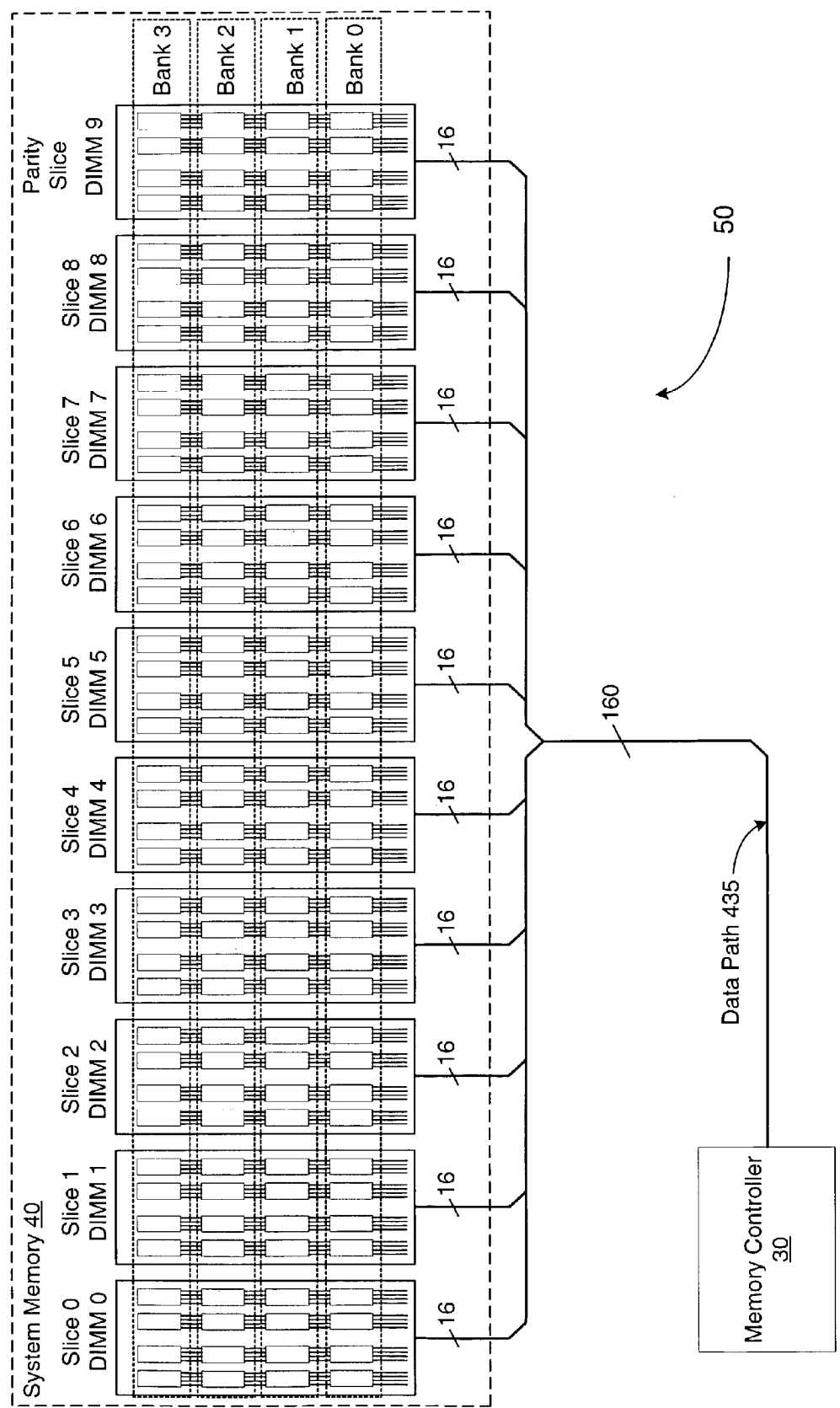
FIG. 4 is a block diagram of one embodiment of a memory subsystem.

Referring to FIG. 4, a block diagram of one embodiment of a memory subsystem is shown. Components that correspond to those shown in FIGS. 1-3 are numbered identically for clarity and simplicity. Memory subsystem 50 includes a memory controller 30 coupled to a system memory 40 via a data path 435 including 160 data signals. System memory 40 includes 10 DIMMs designated DIMM 0 through DIMM 9. It is noted that although only data path 435 is shown coupled to system memory 40, other signals (e.g. address and control signals) may be coupled between system memory 40 and memory controller 30. It is also noted that alternative embodiments may include other numbers of DIMMs and that data path 435 may include other numbers of data signals. It is further noted that although DIMMs are shown in the embodiment of FIG. 4, it is contemplated that in other embodiments, other types of memory modules may be used.

Memory controller 30 may generate memory request operations in response to receiving memory requests from devices such as processor 20A or 20B of FIG. 1, for example. It is noted that memory controller 30 may also receive requests from other sources such as I/O devices (not shown). Memory controller 30 may also schedule the requests and generate corresponding memory requests for transmission on data path 435. The requests may include address and control information (not shown in FIG. 4). For example, if the memory request is a memory read, memory controller 30 may generate one or more requests that include the requested address within system memory 40 and corresponding control information such as start-read or pre-charge commands, for example.

In the illustrated embodiment, the 160 data signals included in data path 435 are grouped into 10 groups of 16 data signals. Each group of 16 data signals represents a respective mutually exclusive set of data signals. Each respective mutually exclusive set of data signals is coupled to a different DIMM. Thus each DIMM is coupled to a portion of data path 435. The data conveyed on data path 435 may be referred to as a data segment, while the data conveyed on each of those groups of 16 data signals may be referred to as a portion.

In the illustrated embodiment, the 10 DIMMs of system memory 40 are grouped according to the 16 data signals to which they are each coupled. Thus there are 10 pieces or portions. Each piece is referred to herein as a "slice." In one embodiment, each slice may include the data stored within one DIMM. Each DIMM may be configured to store a portion of the data corresponding to that portion of data path 435 which is coupled to it. For example, DIMM 0 is coupled to 16 data signals, such as DQ 0-15, for example. In one embodiment, the 16 data signals and DIMM 0 may represent slice 0. Further, DIMM 1 and its associated data signals may correspond to slice 1 and so forth. In addition, one slice is designated as a parity slice. In one embodiment, DIMM 9 and its associated data signals represent parity of slices 0-8. It is noted that in other embodiments, other slices may be used as parity slices.

It is noted that in an alternative embodiment, each of the 16 data signals coupled to a DIMM may be logically divided into two or more portions or slices. In such an alternative embodiment, each DIMM may be used to store two or more slices. For example, if a memory module has 10 DIMMs (0-9), DIMM 0 may be coupled to 16 data signals, such as DQ 0-15. These 16 data signals may include two portions of 8 data signals each. The 16 data signals and DIMM 0 may represent slice 0 and slice 1. Further, DIMM 1 and its associated data signals may correspond to slice 2 and slice 3 and so forth. In addition, one DIMM may be designated as a parity DIMM. Thus in such an embodiment, DIMM 9 and its associated data signals may represent parity of slices 0-15.

The parity slice is configured to convey and store data information which is redundant to the data information stored in DIMMs 0-8. In one embodiment, the parity information may be generated using the Boolean properties of the Exclusive Or (XOR) function such that if 'A' XOR 'B' XOR 'C'='D', then 'D' XOR 'B' XOR 'C'='A'. Thus if 'A' has errors, it may be recreated using 'D, B and C'. Thus, using the XOR function, all the bits of one slice may be recreated using only the other slices and the redundant slice information (e.g. the parity data information). In the illustrated embodiment, the parity data information stored in DIMM 9 is the Exclusive-OR of the data stored in DIMMs 0-8.

It is noted that in an alternative embodiment, more than one slice may be used to convey redundant data information. For example, each redundant slice may include redundant data information of a subset of the other remaining slices, such that the cumulative redundant information contains all the subsets and all of the information. Thus in such an embodiment, it may be possible to reconstruct more than one bad slice.

To improve system reliability and availability, many systems implement error codes in one form or another. It is noted that in one embodiment, an error code may be an error detection code capable of detecting at least one bit error in a group of bits. In another embodiment, an error code may be an error correction code which is also an error detection code which is also capable of correcting the at least one detected bit error. For example, referring collectively to FIG. 1 through FIG. 4, during the storage of data, memory controller 30 may generate an error code which may be conveyed and stored with the data. In one embodiment, upon reading the data from system memory 40, memory controller 30 may check the validity of the data by regenerating and comparing the error code. Depending on the level of protection (i.e. error code strength), memory controller 30 may detect at least one bit error and correct at least one bit error in the data being read out of system memory 40. Alternatively, memory controller 30 may detect at least one bit error in the data being read out of system memory 40.

In another embodiment, errors may be detectable in the address and control information conveyed to a DIMM. Error codes conveyed with the data being stored to one or more DIMMs may not detect errors in the storage of data due to address and control errors. These errors may cause the data to be stored to a wrong address or not to be stored at all. In such an embodiment, a memory controller (e.g., memory controller 30) may convey address and control parity information (not shown) to the DIMMs with the address and control information. Accordingly, using the address and control parity information, a given DIMM may detect an address and control error and report it to the memory controller.

In addition, multiple data errors associated with one particular DIMM may exist. Errors of this magnitude may be caused by a bad memory chip, a bad DIMM socket connection or some other problem which affects the data or data path portion between any single DIMM and memory controller 30. In many cases, this type of error may be impractical to correct using error codes alone. However, memory controller 30 may use the associated error code to detect which DIMM may be faulty or which memory chip on a DIMM may be faulty. In addition, the error code may be used to detect certain types of bit errors in any of the DIMMs, before and after a DIMM failure. An exemplary error code which may be used in one specific implementation is discussed in U.S. patent application Ser. No. 10/185,265 entitled "Error Detection/Correction Code which Detects and Corrects Component Failure and which Provides Single Bit Error Correction Subsequent to Component Failure" and in U.S. patent application Ser. No. 10/184,674 entitled "Error Detection/Correction Code which Detects and Corrects Memory Module/Transmitter Circuit Failure" and in U.S. patent application Ser. No. 10/185,959 entitled "Error Detection/Correction Code which Detects and Corrects a First Failing Component and Optionally a Second Failing Component" (filed concurrently herewith), the disclosures of which are incorporated herein by reference in their entirety.

Further, in one embodiment, memory controller 30 may detect that power conversion unit 45 has either removed Vdd power or has determined that Vdd power has been removed from a given memory module. Removing power from a memory module may look like a complete failure (i.e., multiple bit failures from the slice(s) associated with that memory module) of a memory module to memory controller 30.

If memory controller 30 detects errors or failure in a given slice, the parity data information conveyed and stored in the parity slice may be used in conjunction with the contents stored within the other non-failing slices to recreate the contents of the failed slice without using the contents of that failed slice. Accordingly, the parity slice may be used to correct multiple bit-errors that may come from a single slice.

Since errors associated with each of DIMMs 0-8 may be detected and the parity information may be conveyed and stored in DIMM 9, the data information from a faulty slice may be recreated on-the-fly by a memory controller such as memory controller 30. Thus, memory subsystem 50 may continue to operate with a faulty DIMM, DIMM socket connection or possibly even a faulty data port on a memory controller, for example.

In one embodiment, once a slice has been identified as being faulty, the data information from the faulty slice may continue to be reconstructed each time it is accessed until the problem is fixed. For example, in one embodiment, memory controller 30 may initiate an error message in the form of an interrupt or other message indicating the error condition. In response to receiving such an error message in a system such as the computer system of FIG. 1, processor 20 may send a request for service via email or via a dial-up service through a modem for example. In alternative embodiments, a separate processor (not shown) may be used to handle error indications from memory controller 30 and may be configured to reconfigure the memory subsystem in response to an error indication.

It is also contemplated that in one embodiment, a faulty DIMM such as DIMM 0-9 may be "hot swappable." As used herein, hot swappable refers to the ability of a faulty DIMM to be removed and replaced while memory subsystem 50 continues to operate.

As described above, the ability to isolate power from a memory module may make the system more reliable, available and/or serviceable.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory system comprising:
   a plurality of memory modules each including a plurality of memory chips configured to store data; and
   a power conversion unit coupled to provide a supply voltage and a supply current to each of said plurality of memory modules via a respective power conduit;
   wherein the respective power conduits are electrically isolated from each other;
   wherein in response to sensing an excessive supply current in a respective power conduit of a given memory module, said power conversion unit is configured to interrupt power to a corresponding respective power conduit while continuing to provide power to each other respective power conduit; and
   wherein the excessive supply current corresponds to a short circuit between the supply voltage and a circuit ground reference on the given memory module.

2. The memory system as recited in claim 1 further comprising a memory controller coupled to said plurality of memory modules and is configured to correct errors in said data caused by an interruption in power to a given memory module.

3. The memory system as recited in claim 1, wherein said power conversion unit includes an isolation unit having a plurality of respective isolation circuits, each coupled to a corresponding respective memory module and configured to sense the excessive supply current on the corresponding respective memory module.

4. The memory system as recited in claim 3, wherein in response to sensing the excessive supply current on the corresponding respective memory module, each of said respective isolation circuits is further configured to interrupt power to a corresponding respective power conduit.

5. A memory system comprising:
   a plurality of memory modules each including a plurality of memory chips configured to store data;
   a power conversion unit coupled to provide a supply voltage and a supply current to each of said plurality of memory modules via a respective power conduit;
   wherein the respective power conduits are electrically isolated from each other; and
   a plurality of respective isolation units, each coupled between a corresponding respective power conduit and said power conversion unit, wherein each of said respective isolation units is configured to sense an excessive supply current in the corresponding respective power conduit and to interrupt power to said corresponding respective power conduit;
   wherein the excessive supply current corresponds to a short circuit between the supply voltage and a circuit ground reference on the given memory module.

6. A computer system comprising:
   a system board including a memory system, wherein said memory system includes:
      a plurality of memory modules connectable to said system board, wherein each of said plurality of memory modules includes a plurality of memory chips configured to store data; and
      a power conversion unit coupled to provide a supply voltage and a supply current to each of said plurality of memory modules via a respective power conduit;
      wherein the respective power conduits are electrically isolated from each other;
      wherein in response to sensing an excessive supply current in a respective power conduit of a given memory module, said power conversion unit is configured to interrupt power to a corresponding respective power conduit while providing power to each other respective power conduit; and
      wherein the excessive supply current corresponds to a short circuit between the supply voltage and a circuit ground reference on the given memory module.

7. The computer system as recited in claim 6, wherein said memory system further includes a memory controller coupled to said plurality of memory modules and configured to correct errors in said data caused by an interruption in power to a given memory module.

8. The computer system as recited in claim 6, wherein said power conversion unit includes an isolation unit having a plurality of respective isolation circuits, each coupled to a corresponding respective memory module and configured to sense the excessive supply current on the corresponding respective memory module.

9. The computer system as recited in claim 8, wherein in response to sensing the excessive supply current on the corresponding respective memory module, each of said respective isolation circuits is further configured to interrupt power to a corresponding respective power conduit.

10. The computer system as recited in claim 6, further comprising a processor board including one or more processors, wherein said processor board is coupled to said system board.

11. A method of supplying a supply voltage and a supply current to a plurality of memory modules, said method comprising:
- isolating each of said plurality of memory modules via an independent respective power conduit, wherein the respective power conduits are isolated from each other;
- detecting an excessive supply current in a respective power conduit of a given memory module, wherein the excessive supply current corresponds to a short circuit between the supply voltage and a circuit ground reference on the given memory module;
- in response to detecting the excessive supply current in the respective power conduit of said given memory module, interrupting power to the respective power conduit having the excessive current while continuing to provide said supply voltage and supply current to each other respective power conduit.

12. The method as recited in claim 11 further comprising correcting errors in retrieved data caused by an interruption in power to a given memory module.

13. A memory system comprising:
- a plurality of memory modules each including a plurality of memory chips configured to store data;
- means for providing a supply voltage and a supply current to each of said plurality of memory modules via a respective power conduit;
- wherein the respective power conduits are electrically isolated from each other;
- means for sensing an excessive supply current in a respective power conduit of a given memory module, wherein the excessive supply current corresponds to a short circuit between the supply voltage and a circuit ground reference on the given memory module; and
- means for interrupting said supply voltage and said supply current to a corresponding respective power conduit while continuing to provide said supply voltage and said supply current to each other respective power conduit in response to sensing said excessive supply current in said respective power conduit of said given memory module.

14. The memory system as recited in claim 13 further comprising means for correcting errors in said data caused by an interruption in said supply voltage and said supply current to a given memory module.

* * * * *